United States Patent
Son et al.

(10) Patent No.: US 7,459,353 B2
(45) Date of Patent: Dec. 2, 2008

(54) METHODS OF LATERALLY FORMING SINGLE CRYSTALLINE THIN FILM REGIONS FROM SEED LAYERS

(75) Inventors: Yong-Hoon Son, Gyeonggi-do (KR); Yu-Gyun Shin, Gyeonggi-do (KR); Jong-Wook Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 145 days.

(21) Appl. No.: 11/378,731

(22) Filed: Mar. 17, 2006

(65) Prior Publication Data
US 2006/0211262 A1    Sep. 21, 2006

(30) Foreign Application Priority Data
Mar. 18, 2005  (KR) .................... 10-2005-0022509

(51) Int. Cl.
*H01L 21/00*  (2006.01)
(52) U.S. Cl. .............. 438/151; 438/166; 438/487; 257/E21.133; 257/E21.409
(58) Field of Classification Search ............... 438/151, 438/166, 487; 257/E21.409, E21.133
See application file for complete search history.

(56) References Cited

U.S. PATENT DOCUMENTS

| | | | | |
|---|---|---|---|---|
| 5,972,105 | A | 10/1999 | Yamazaki et al. | 117/8 |
| 6,645,454 | B2 | 11/2003 | Voutsas | 423/348 |
| 6,767,804 | B2 | 7/2004 | Crowder | 438/487 |
| 6,919,238 | B2 * | 7/2005 | Bohr | 438/166 |
| 2004/0016969 | A1 * | 1/2004 | Bohr | 257/347 |
| 2004/0018672 | A1 * | 1/2004 | Bohr | 438/166 |
| 2005/0277235 | A1 * | 12/2005 | Son et al. | 438/166 |

FOREIGN PATENT DOCUMENTS

| | | |
|---|---|---|
| JP | 2001-308008 | 11/2001 |
| JP | 2002-359159 | 12/2002 |
| KR | 1020020091896 | 12/2002 |
| KR | 1020040098108 | 11/2004 |

* cited by examiner

*Primary Examiner*—Scott B. Geyer
*Assistant Examiner*—Stanetta D Isaac
(74) *Attorney, Agent, or Firm*—Myers Bigel Sibley & Sajovec, P.A.

(57) ABSTRACT

A method of forming an integrated circuit can be provided by successively laterally forming single crystalline thin film regions from an amorphous thin film using a lower single crystalline seed layer.

23 Claims, 6 Drawing Sheets

METHODS OF LATERALLY FORMING SINGLE CRYSTALLINE THIN FILM REGIONS FROM SEED LAYERS

CROSS-REFERENCE TO RELATED APPLICATIONS

This application claims priority under 35 U.S.C. § 119 to Korean Patent Application No. 2005-22509, filed on Mar. 18, 2005, the contents of which are herein incorporated by reference in their entirety.

FIELD OF THE INVENTION

The invention relates to the formation of single crystalline thin films.

BACKGROUND

Generally, materials may be classified as single crystalline materials, polycrystalline materials, or amorphous materials. A single crystalline material is one that has a single crystalline unit structure, while a polycrystalline material has a structure comprising a plurality of crystalline structure units. An amorphous material may not include a defined crystal structure, as atoms in the amorphous materials may be irregularly bonded to each other. The polycrystalline material typically has many grain boundaries due to the plurality of crystal structure units. The movement of carriers such as electrons or holes may be limited by these grain boundaries.

Thus, in a method of manufacturing a semiconductor device or a system-on-chip (SOC) device including thin-film transistors (TFTs) having stacked structures, single crystalline silicon thin films are often used as channel layers in the active regions of the TFTs. A single crystalline silicon thin film is one that includes a high density of relatively large single crystalline grains in order to improve mobility of these carriers.

To form a single crystalline silicon thin film, an amorphous silicon thin film may be formed on an insulating layer, and the amorphous silicon thin film is thermally treated to form the single crystalline silicon thin film.

Methods of manufacturing a single crystalline silicon thin film are discussed in, for example, Korean Laid-Open Patent Publication No. 2002-91896, Korean Laid-Open Patent Publication No. 2004-98108, Japanese Laid-Open Patent Publication No. 2001-308008, Japanese Laid-Open Patent Publication No. 2002-359159, and U.S. Pat. No. 5,972,105, etc.

In Korean Laid-Open Patent Publication No. 2002-91896, and Japanese Laid-Open Patent Publication No. 2002-359159, a portion of an amorphous silicon thin film is transformed into a single crystalline seed thin film by a first laser heat treatment. Then, a residual portion of the amorphous silicon thin film is transformed into a single crystalline silicon thin film by a second laser heat treatment, using the single crystalline seed thin film formed by the first laser heat treatment as a seed.

A single crystalline silicon thin film, which has a high density of relatively large single crystalline grains, may be easily formed by the above-described method. However, the method may have a disadvantage in that the method may involve the use of a photoresist layer pattern during the first laser heat treatment by which the single crystalline seed thin film is formed, and the method may involve using the laser twice in forming the single crystalline silicon thin film, which may cause a process to become complicated.

The present applicant filed Korean Patent Application No. 2004-43265 on Jun. 12, 2004, which was entitled "Semiconductor Device and Method of Manufacturing the Same" and is now pending in the Korean Intellectual Property Office, regarding a method of forming a single crystalline silicon thin film transformed from an amorphous silicon thin film by irradiating a laser onto the amorphous silicon thin film.

The above method is capable of forming a single crystalline silicon thin film having a high density of relatively large single crystalline grains through a relatively simple process. However, in the method of forming a single crystalline silicon thin film, as shown in FIG. 1, a plurality of seed thin films 10 in a unit cell may be employed. Thus, boundary portions A among multiple single crystalline silicon thin films adjacent to each other exist, so that grain boundaries adjacent to the boundary portions A may be formed. In addition, it may be difficult to form the single crystalline silicon thin film in a peripheral region, in which the seed thin film 10 may not be formed.

SUMMARY

Embodiments according to the invention may provide methods of laterally forming single crystalline thin film regions from seed layers. Pursuant to these embodiments, a method of forming an integrated circuit may be provided by successively laterally forming single crystalline thin film regions from an amorphous thin film using a lower single crystalline seed layer. In some embodiments according to the invention, successively laterally forming may include successively impinging laser light onto laterally spaced-apart regions of the amorphous thin film to change the phase thereof into the respective single crystalline thin film regions.

In some embodiments according to the invention, successively impinging laser light onto laterally spaced-apart regions of the amorphous thin film may include substantially continuously moving the laser light laterally away from the lower single crystalline seed layer. In some embodiments according to the invention, successively impinging laser light onto laterally spaced-apart regions of the amorphous thin film may include moving the laser light laterally in discrete increments so that the laser light impinges the amorphous thin film at points corresponding to the respective single crystalline thin film regions.

In some embodiments according to the invention, successively laterally forming single crystalline thin film regions may further include changing a phase of a first region of the amorphous thin film directly on the lower single crystalline seed layer to provide a first single crystalline thin film region, then changing a phase of a second region of the amorphous thin film in direct lateral contact with the first single crystalline thin film region to provide a second single crystalline thin film region, and then changing a phase of a third region of the amorphous thin film in direct lateral contact with the second single crystalline thin film region to provide a third single crystalline thin film region.

In some embodiments according to the invention, the first region of the amorphous thin film may be larger than the second region of the amorphous thin film which may be larger than the third region of the amorphous thin film. In some embodiments according to the invention, successively impinging laser light onto laterally spaced-apart regions of the amorphous thin film may include impinging the laser light onto the laterally spaced-apart regions of the amorphous thin film to heat the laterally spaced-apart regions of the amorphous thin film to a temperature of about 1410 degrees centigrade.

In some embodiments according to the invention, the lower single crystalline seed layer may include a vertical single crystalline silicon plug in an insulating layer. In some embodiments according to the invention, the lower single crystalline seed layer may extend from a single crystalline silicon substrate to the amorphous thin film and the method may further include heating the single crystalline silicon substrate at a temperature of about 200 to about 600° C. while impinging the laser light onto the amorphous thin film.

In some embodiments according to the invention, successively laterally forming single crystalline thin film regions from an amorphous thin film using a lower single crystalline seed layer may include successively laterally forming the single crystalline thin film regions in a peripheral region of the integrated circuit.

In some embodiments according to the invention, a method of manufacturing a semiconductor device may include forming a first insulation layer on a first single crystalline structure including a single crystalline material, the first insulation layer having an opening that exposes the first single crystalline structure. A first seed layer may be formed including the single crystalline material in the opening. A first amorphous thin film may be formed on the first insulation layer and the first seed layer. A phase of a first region may be formed of the first amorphous thin film, the first region of the first amorphous thin film being overlapped with the first seed layer. The first region of the first amorphous thin film may be transformed into a first single crystalline thin film including the single crystalline material, by converting a crystalline structure of the first region of the first amorphous thin film into a single crystalline structure, using the single crystalline material in the first seed layer as a seed during a phase transition of the first region of the first amorphous thin film. A phase of a second region of the first amorphous thin film may be changed, the second region of the first amorphous thin film being adjacent to the first single crystalline thin film. The second region of the first amorphous thin film may be transformed into a second single crystalline thin film including the single crystalline material, by converting a crystalline structure of the second region of the first amorphous thin film into a single crystalline structure, using the single crystalline material in the first single crystalline thin film as a seed during a phase transition of the second region of the first amorphous thin film.

In some embodiments according to the invention, a method of manufacturing a semiconductor device includes forming a first semiconductor structure including a transistor on a single crystalline silicon substrate. A first insulation layer may be formed including an opening that exposes the single crystalline silicon substrate having the first semiconductor structure. A first seed layer may be formed including single crystalline silicon in the opening by a selective epitaxial growth process. An amorphous silicon thin film may be continuously formed on the first insulation layer and the first seed layer. A phase of a first region of the first amorphous silicon thin film may be changed, the first region of the first amorphous silicon thin film being overlapped with the first seed layer. The first region of the first amorphous silicon thin film may be transformed into a first single crystalline silicon thin film, by converting a crystalline structure of the first region of the first amorphous silicon thin film into the single crystalline silicon, using the single crystalline silicon in the first seed layer as a seed during a phase transition of the first region of the first amorphous silicon thin film. A phase of a second region of the first amorphous silicon thin film may be provided adjacent to the first single crystalline silicon thin film and the second region of the first amorphous silicon thin film may be transformed into a second single crystalline silicon thin film, by converting a crystalline structure of the second region of the first amorphous silicon thin film into the single crystalline silicon, using the single crystalline silicon in the first single crystalline silicon thin film as a seed during a phase transition of the second region of the first amorphous silicon thin film, to form a first channel layer including the first and the second single crystalline silicon thin films.

DESCRIPTION OF EMBODIMENTS ACCORDING TO THE INVENTION

Figure 1:
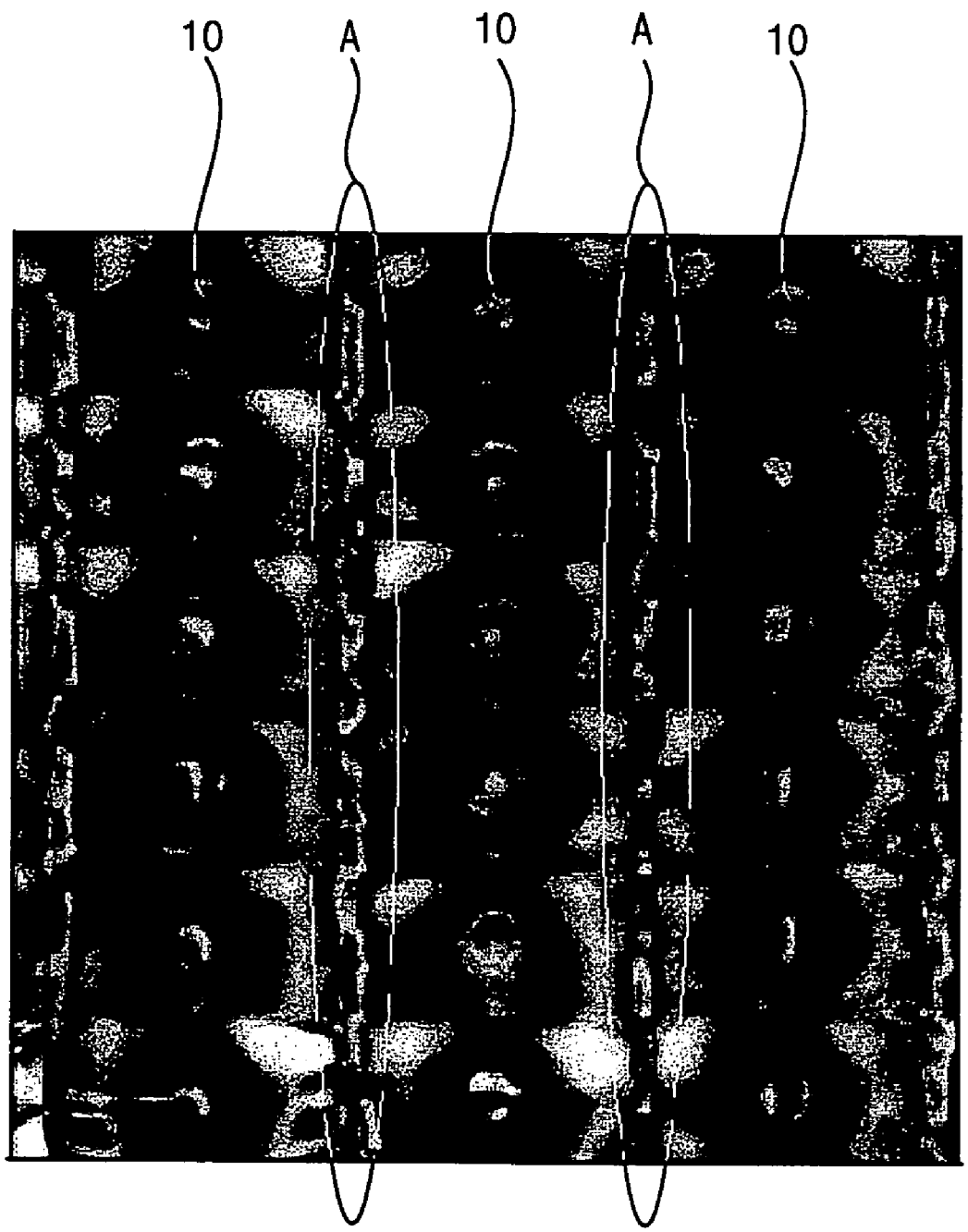
FIG. 1 is an electron microscopic photograph of a single crystalline silicon thin film manufactured by a conventional method.

The present invention is described more fully hereinafter with reference to the accompanying drawings, in which example embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 2A to 2D are cross-sectional views illustrating a method of manufacturing a semiconductor device in accordance with an example embodiment of the present invention. FIGS. 3A to 3D are plan views illustrating the method of manufacturing the semiconductor device in FIGS. 2A to 2D, respectively.

Figure 2A:
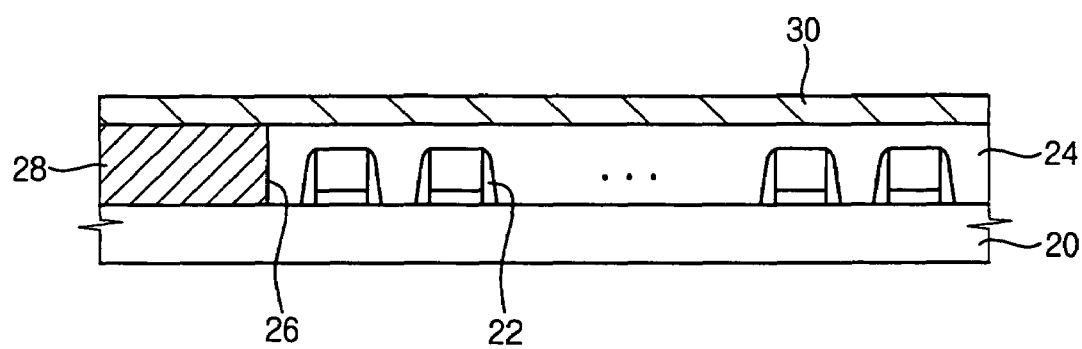
FIGS. 2A to 2D are cross-sectional views illustrating methods of manufacturing a semiconductor device in some embodiments according to the present invention.
Figure 3A:
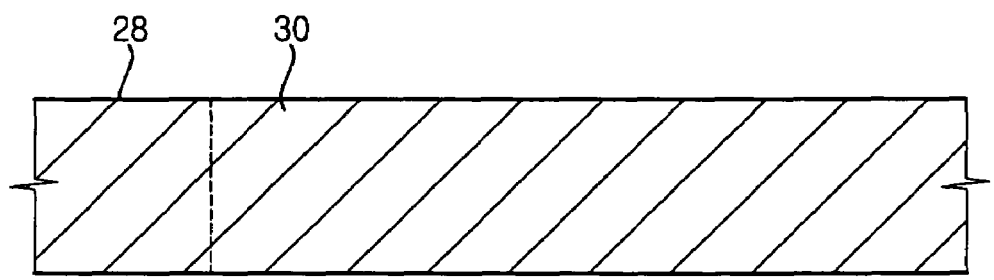
FIGS. 3A to 3D are plan views illustrating methods of manufacturing the semiconductor device shown in FIGS. 2A to 2D in some embodiments according to the present invention.

Referring to FIGS. 2A and 3A, a first single crystalline structure 20 including a single crystalline material is provided. The single crystalline material may include single crystalline silicon, single crystalline germanium, etc. In one example embodiment of the present invention, the first single crystalline structure 20 may include a silicon substrate, a silicon-on-insulator (SOI) substrate, a germanium substrate, a silicon-germanium substrate, etc. In another example embodiment of the present invention, the first crystalline structure 20 may include a single crystalline thin film formed from an amorphous thin film through a phase transition process. The first single crystalline structure 20 may include the silicon substrate.

A first semiconductor structure 22 is formed on the first single crystalline structure 20. The first semiconductor structure 22 may include a transistor, a metal wiring, a logic element, etc. The first semiconductor structure 22 may further include various elements in accordance with a type of a semiconductor device.

A first insulation layer 24 is formed on the first single crystalline structure 20 to cover the first semiconductor structure 22. The first insulation layer 24 may be formed using an oxide such as silicon oxide. For example, the first insulation layer 24 is formed using undoped silicate glass (USG), spin-on glass (SOG), high-density plasma chemical vapor deposition (HDP-CVD) oxide, flowable oxide (FOX), tetraethylorthosilicate (TEOS), plasma-enhanced tetraethylorthosilicate (PE-TEOS), phosphor silicate glass (PSG), boro-phosphor silicate glass (BPSG), etc.

The first insulation layer 24 is partially etched to thereby form an opening 26 exposing the first single crystalline structure 20. The opening 26 may be formed using a photoresist pattern as an etching mask after the photoresist pattern is formed on the first insulation layer 24. In one example embodiment of the present invention, one opening 26 may be formed relative to one first single crystalline structure 20. In another embodiment of the present invention, one opening 26 may be formed relative to one unit cell of the semiconductor device.

A first seed layer 28 is formed on the first single crystalline structure 20 in the opening 26. The first seed layer 28 may be formed by a selective epitaxial growth (SEG) process. For example, the first seed layer 28 is formed by a liquid phase epitaxy process, a vapor phase epitaxy process, a molecular beam epitaxy process, etc. The first seed layer 28 may be advantageously formed by the vapor phase epitaxy process.

In the SEG process, the first seed layer 28 is grown from a surface of the first single crystalline structure 20 exposed through the opening 26 so that the first seed layer 28 may have a crystalline structure substantially the same as that of the first single crystalline structure 20. When the first single crystalline structure 20 includes the silicon substrate, the first seed layer 28 may include single crystalline silicon.

In an example embodiment of the present invention, the opening 26 may be filled with the first seed layer 28. In other words, the first seed layer 28 may have a thickness substantially the same as that of the first insulation layer 24. The first seed layer 28 may be positioned on the first insulation layer 24 around the opening 26. The first seed layer 28 may be polished to remove a portion of the first seed layer 28 formed on the first insulation layer 28 around the opening 26. The first seed layer 28 may be partially removed by a chemical mechanical polishing (CMP) process.

After the first seed layer 28 filling up the opening 26 is formed, a first amorphous thin layer 30 is continuously formed on the first insulation layer 24 and the first seed layer 28. The first amorphous thin layer 30 may include an amorphous material. When the first single crystalline structure 20 includes the silicon substrate, the first amorphous silicon thin film 30 may include amorphous silicon. Alternatively, when the first single crystalline structure 20 includes the germanium substrate, the first amorphous silicon thin film 30 may include amorphous germanium. Furthermore, when the first single crystalline structure 20 includes the silicon-germanium substrate, the first amorphous silicon thin film 30 may include amorphous silicon-germanium.

The first amorphous thin film 30 may be formed by a chemical vapor deposition (CVD) process. The first amorphous thin film 30 may have a relatively thin thickness; however, the thickness of the first amorphous thin film 30 may vary as occasion demands.

Figure 2B:
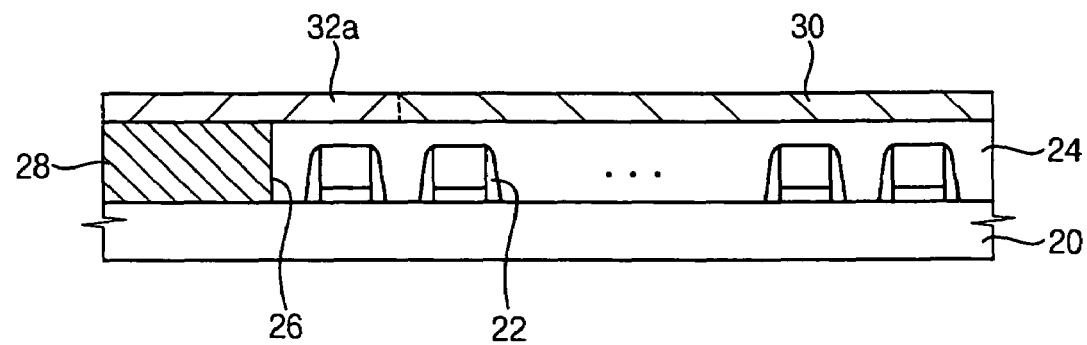
Figure 3B:
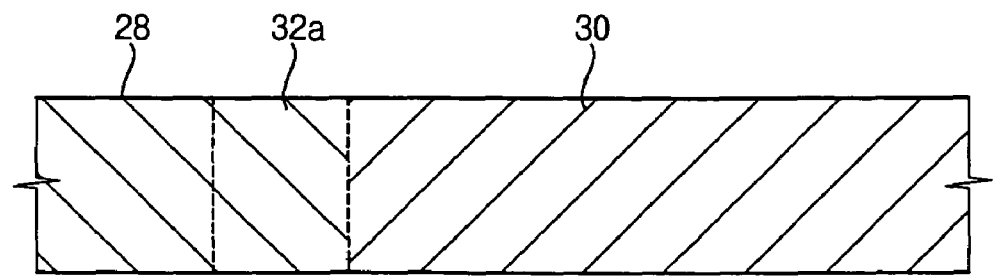

Referring to FIGS. 2B and 3B, a phase of a first region of the first amorphous thin film 30 is changed. That is, the first amorphous thin film 30 is partially phase-changed. The first region of the first amorphous thin film 30 includes a portion of the first amorphous thin film 30 overlapped (in direct contact with) with the first seed layer 28. When the first region of the first amorphous thin film 30 is phase-changed, the single crystalline material in the first seed layer 28 may serve as a seed. After the phase transition process of the first amorphous thin film 30, the first region of the first amorphous thin film 30 has a liquid phase changed from a solid phase. The phase of the first region of the first amorphous thin film 30 may be changed by partially melting the first amorphous thin film 30.

As appreciated by the present inventors, if the first amorphous thin film 30 is partially melted by a thermal treatment process using a furnace, the first semiconductor structure 22 may have serious damage because the thermal treatment process is executed at a high temperature. Additionally, the first region of the first amorphous thin film 30 may not be easily melted using the furnace. Therefore, the first region of the first amorphous thin film 30 may be advantageously melted by impinging or irradiating a laser beam (i.e., laser light) onto the first region of the first amorphous thin film 30.

When the phase transition of the first region of the first amorphous thin film 30 occurs in accordance with the irradiation of the laser beam, the first region of the first amorphous thin film 30 may have a single crystalline structure based on the single crystalline material in the first seed layer 28 serving as the seed. A transformation of the crystalline structure of the first region of the first amorphous thin film 30 may proceed along a vertical direction and a horizontal direction. Since the phase transition and the crystalline structure transformation of the first region of the first amorphous thin film 30 may occur for several nanoseconds, the first region of the first amorphous thin film 30 may not flow from the first seed layer 28 even though the phase of the first region of the first amorphous thin film 30 is changed into the liquid phase from the solid phase.

The laser beam irradiated onto the first amorphous thin film 30 may have a sufficient energy to melt the entire first amorphous thin film 30 based on the thickness of the first amorphous thin film 30 because the liquid phase is generated from a surface of the first region of the first amorphous thin film 30 to an interface between the first region of the first amorphous thin film 30 and the first seed layer 28. The energy of the laser beam may mainly vary in accordance with the thickness of the first amorphous thin film 30. When the first amorphous thin film 30 includes the amorphous silicon, the laser beam may have an energy capable of generating a temperature of above about 1,410° C. because the amorphous silicon may be melted at this temperature.

Meanwhile, the first seed layer 28 may not be substantially affected by the irradiation of the laser beam because the first seed layer 28 has an absorption coefficient different from that of the first amorphous thin film 30 even though the phase of the first region of the first amorphous thin film 30 is changed.

In an example embodiment of the present invention, the first single crystalline structure 20 may be thermally treated when the phase of the first region of the first amorphous thin film 30 is changed. In the thermal treatment process for the first region of the first amorphous thin film 30, a temperature gradient in the first region of the first amorphous thin film 30 may decrease so that the first region of the first amorphous thin film 30 may have more grains. When the first single crystalline structure 20 is heated at a temperature of below about 200° C., the grains in first region of the first amorphous thin film 30 may have limited sizes. When the thermal treatment process is executed at a temperature of above about 600° C., a proper apparatus for heating the first single crystalline structure 20 may not be equipped. Therefore, the first single crystalline structure 20 may be advantageously heated at a temperature of about 200 to about 600° C. For example, the first single crystalline structure 20 is thermally treated at a temperature of about 350 to about 450° C.

As described above, the single crystalline materials in the first seed layer 28 serve as the seeds in the phase transition of the first region of the first amorphous thin film 30 so that the first region of the first amorphous thin film 30 has the single crystalline structure after the phase of the first region of the first amorphous thin film 30 is changed. As a result, the first region of the first amorphous thin film 30 is converted into a first single crystalline thin film 32a. In an example embodiment of the present invention, the first seed layer 28 includes single crystalline silicon and the first amorphous thin film 30 includes amorphous silicon so that the first single crystalline thin film 32a includes single crystalline silicon.

In an example embodiment of the present invention, since the phase transition of the first region of the first amorphous thin film 30 may occur for several nanoseconds, the first single crystalline layer 32a formed through the phase transition process may not have defects therein. Further, the grains in the first single crystalline thin film 32a may be easily enlarged because the first seed layer 28 including the single crystalline material serves as the seed. That is, when the first seed layer 28 serves as the seed and the phase of the first region of the first amorphous thin film 30 is changed, the first single crystalline thin film 32a may include dense and large grains.

It will be understood that the laser light can be impinged onto the first amorphous thin film 30 (and other amorphous thin films) in a continuous fashion or using discrete steps. For example, in a continuous application, the laser light may be initially applied to the first region of the amorphous thin film 30 above the seed layer 28 and moved continuously across the amorphous thin film 30 away from the seed layer 28 at rate that allows for sufficient heating to provide for the phase change of the amorphous layer into the single crystalline thin films corresponding to the first and other regions.

It will be understood that in some embodiments according to the invention, the laser light can be moved in discrete steps according to predetermined pattern according to the locations of the regions. In still other embodiments according to the invention, the laser light is moved continuously and activated/deactivated at the appropriate intervals according to the discrete pattern. It will be further understood that the laser beam can be "moved" by, for example, moving a mirror above the amorphous thin film 30 to reflect the laser light. Alternatively, the laser that generates the laser beam may be moved above the amorphous thin film 30.

In still other embodiments according to the invention, the substrate can be moved beneath a "fixed" laser light. Alternatively, the substrate can be moved beneath a fixed laser light continuously along one axis, with activation of the laser light being synchronized with the regions of the amorphous thin film 30. The laser light may be impinged in a single pulse or a number of pulses delivered to each region.

Figure 2C:
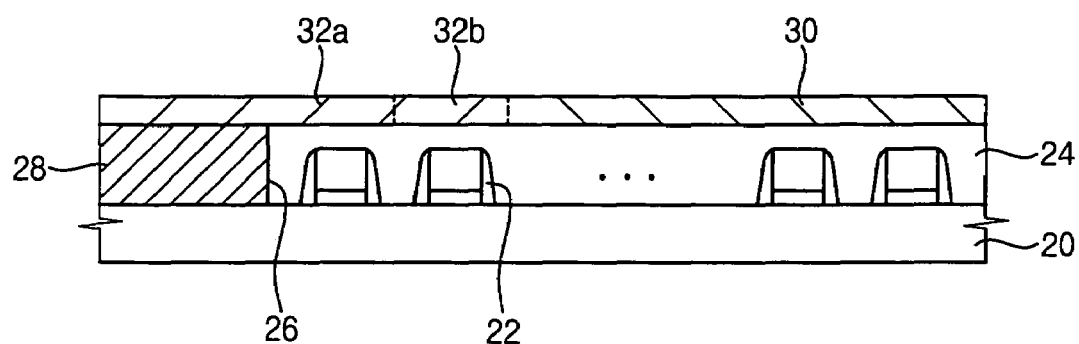
Figure 3C:
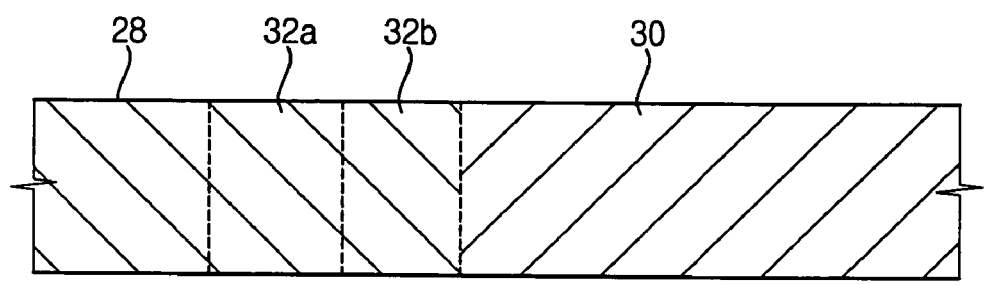

Referring to FIGS. 2C and 3C, a phase of a second region of the first amorphous thin film 30 adjacent to the first single crystalline thin film 32a is changed. The phase transition process for the second region of the first amorphous thin film 30 may be substantially the same as the phase transition process for the first region of the first amorphous thin 30 described with reference to FIGS. 2B and 3B except that the first single crystalline thin film 32a serves as a seed and the second region of the first amorphous thin film 30 has an area substantially smaller than that of the first region of the first amorphous thin film 30.

When the phase of the second region of the first amorphous thin film 30 is changed to convert a crystalline structure of the second region of the first amorphous thin film 30, the first single crystalline thin film 32a serves as the seed so that the second region of the first amorphous thin film 30 may have the area substantially smaller than that of the first region of the first amorphous thin film 30.

In one example embodiment of the present invention, after a laser beam is irradiated from the first region of the first amorphous thin film 30 to the second region of the first amorphous thin film 30, the phase of the second region of the first amorphous thin film 30 may be changed by irradiating the laser beam onto the second region of the first amorphous thin film 30. In another embodiment of the present invention, the laser beam may be continuously irradiated from the first region to the second region of the first amorphous thin film 30 to thereby continuously change the phases of the first and the second regions of the first amorphous thin film 30. Thus, the first and the second regions of the first amorphous thin film 30 may be partially overlapped each other rather than the first region is separated from the second region.

When the phase of the second region of the first amorphous thin film 30 is changed, the first single crystalline thin film 32a serves as the seed so that the second region of the first amorphous thin film 30 has a single crystalline structure. Therefore, the second region of the first amorphous thin film 30 is changed into a second single crystalline thin film 32b including a single crystalline material. In an example embodiment of the present invention, since the first single crystalline thin film 32a includes single crystalline silicon, the second single crystalline thin film 32b may also include single crystalline silicon.

Figure 2D:
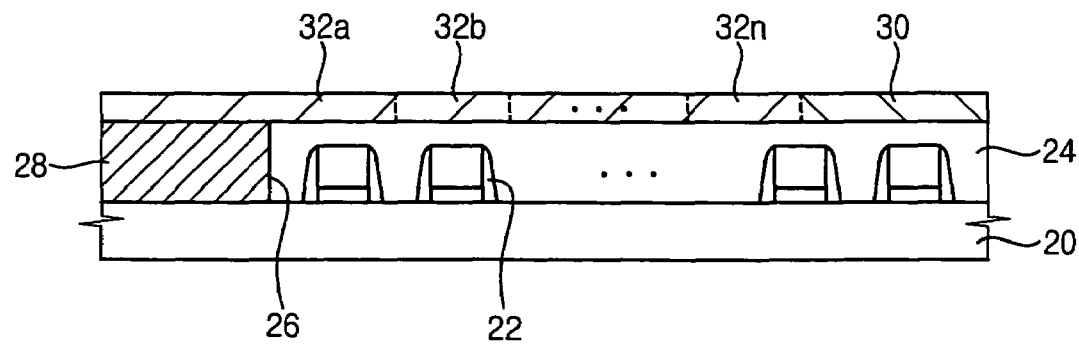
Figure 3D:
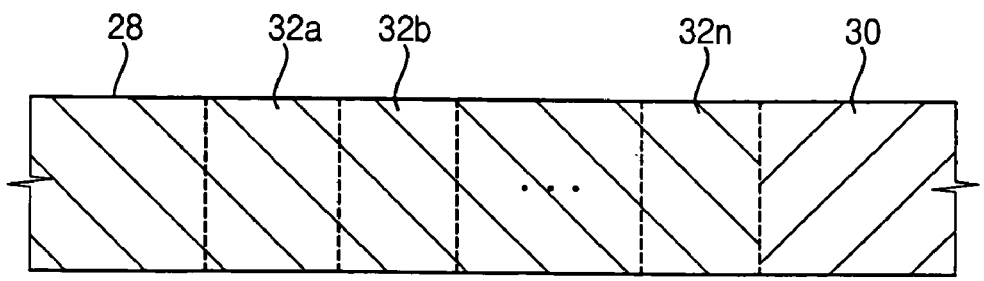

Referring to FIGS. 2D and 3D, a phase of a third region of the first amorphous thin film 30 adjacent to the second single crystalline thin film 32b to a phase of an Nth (N is a positive integer) region of the first amorphous thin film 30 adjacent to an (N−1)th region of the first amorphous thin film 30 are sequentially changed.

The third region of the first amorphous thin film 30 may have an area substantially smaller than that of the second region of the first amorphous thin film 30, and the Nth region of the first amorphous thin film 30 may have an area substantially smaller than that of the (N−1)th region of the first amorphous thin film 30 because the single crystalline thin films previously formed serve as seeds as described above. Further, a laser beam may be continuously irradiated onto all of the regions of the first amorphous thin film 30 when the phases of all the regions of the first amorphous thin film 30 are changed. Although an irradiation speed of the laser beam from the first region to the Nth region of the first amorphous thin film 30 may vary, the laser beam may be irradiated from the first to the Nth regions of the first amorphous thin film 30 for sufficient times so as to sufficiently melt each of the first to the Nth regions of the first amorphous thin film 30.

When the phase of the third region of the first amorphous thin film 30 is changed, the second single crystalline thin film 32b serves as the seed so that the third region of the first amorphous thin film 30 may have the single crystalline structure. Thus, the third region of the first amorphous thin film 30 may be converted into a third single crystalline thin film (not shown). Similarly, when the phase of the Nth region of the first amorphous thin film 30 is changed, an (N−1)th single crystalline thin film formed from the Nth region serves as a seed so that the Nth region of the first amorphous thin film 30 may also have a single crystalline structure. As a result, the Nth region of the first amorphous thin film 30 may be converted into an Nth single crystalline thin film 32n.

In an example embodiment of the present invention, the phases of the regions of the first amorphous thin film 30 on the first insulation layer 24 may be continuously changed using the first seed layer 28 serve as the seed, and the crystalline structures of the regions of the first amorphous thin film 30 may be converted into the single crystalline structures using the single crystalline thin films previously formed serve as the seeds so that a second single crystalline structure including the first single crystalline thin film 32a to the Nth single crystalline thin film 32n may be formed on the first insulation layer 24. Therefore, only one seed layer may be sufficiently employed as the seed in order to form the second single crystalline structure on the first insulation layer 24.

Further, the second single crystalline structure may have sufficiently enlarged grains and the second single crystalline structure may be formed with ease in a region in which the first seed layer 28 may not be easily formed such as a peripheral region.

In an example embodiment of the present invention, the single crystalline structures including dense and large grains and fewer grain boundaries may be formed. Furthermore, the single crystalline structures may be easily formed in desired regions. Therefore, the method of forming the single crystalline structure in accordance with an embodiment of the present invention may be advantageously employed in a process of forming a channel layer having a stacked structure.

Figure 4:
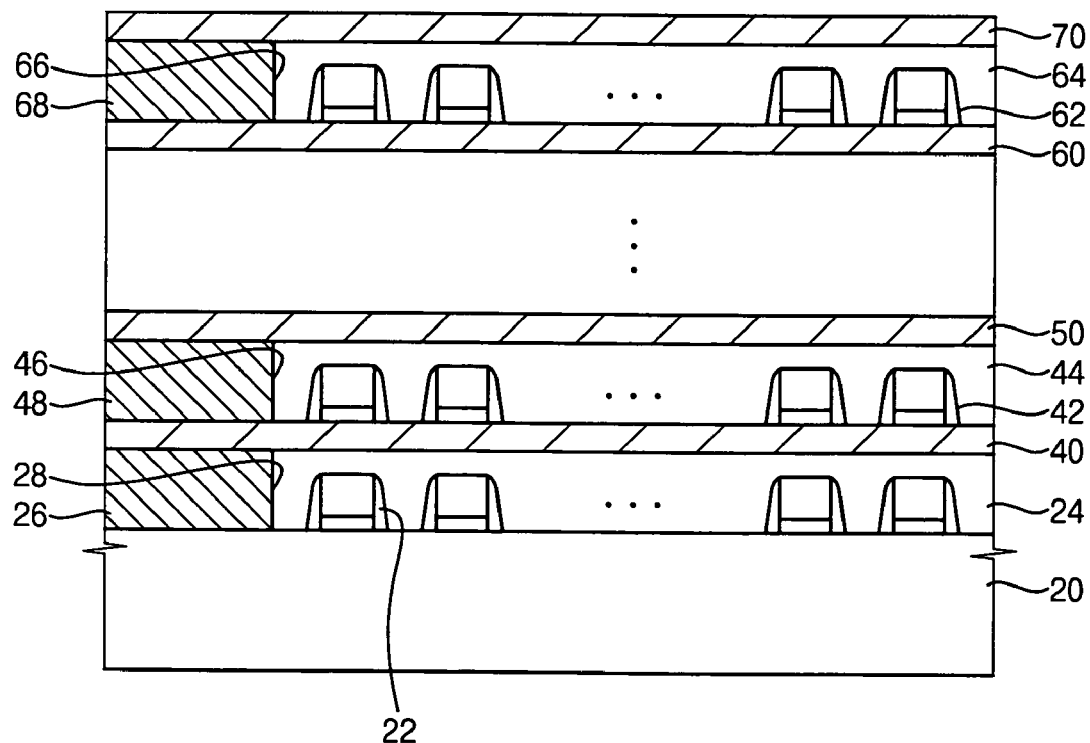
FIG. 4 is a cross-sectional view illustrating methods of manufacturing a device in some embodiments according to the present invention.

FIG. 4 is a cross-sectional view illustrating a method of manufacturing a semiconductor device in accordance with an example embodiment of the present invention. Referring to FIG. 4, a second single crystalline structure 40 serving as a seed is formed on a first single crystalline structure 20 such as a silicon substrate through processes substantially the same as those described with reference to FIGS. 2A to 2D. The second single crystalline structure 40 may include a first single crystalline thin film 32a to an Nth single crystalline thin film 32n as shown in FIGS. 2A to 2D.

A second semiconductor structure 42 is formed on the second single crystalline structure 40 using the second single crystalline structure 40 as a channel layer. The second semiconductor structure 42 may include a transistor, a metal wiring, a logic element, etc. The second semiconductor structure 42 may further include various elements in accordance with a type of a semiconductor device as described above.

A second insulation layer 44, an opening 46 and a second seed layer 48, which are substantially the same as the first insulation layer 24, the opening 26 and the first seed layer 28 in FIGS. 2A to 2D, respectively, are formed on the second single crystalline structure 40 including the second semiconductor structure 42. A second amorphous thin film substantially the same as the first amorphous thin film 30 in FIGS. 2A to 2D may be formed on the second insulation layer 44 and the second seed layer 48. The second amorphous thin film may be converted into a third single crystalline structure 50 by processes substantially the same as the processes for forming the second single crystalline structure 40 described with reference to FIGS. 2A to 2D.

Further, a Jth (J is a positive integer) single crystalline structure 60 substantially the same as the second single crystalline structure 40 in FIGS. 2A to 2D, an Rth (R is a positive integer) semiconductor structure 62 similar to the first semiconductor structure 22 in FIGS. 2A to 2D, a Pth (P is a positive integer) insulation layer 64 substantially the same as the first insulation layer 24 in FIGS. 2A to 2D, an Mth (M is a positive integer) seed layer 68 substantially the same as the first seed layer 28 in FIGS. 2A to 2D, and a (J+1)th single crystalline structure 70 may be repeatedly formed on the third single crystalline structure 50. In an example embodiment of the present invention, a plurality of the single crystalline structures may be repeatedly formed to manufacture a highly integrated semiconductor device.

According to the present invention, the single crystalline thin film including dense and large size grains may be formed by a simple process, and the single crystalline thin film may be easily formed in a region in which a seed layer may not be easily formed such as a peripheral region. Furthermore, the single crystalline thin film of the present invention may have fewer grain boundaries.

Therefore, the method of forming the single crystalline thin film in accordance with the present invention may be advantageously employed in a method of forming a channel layer having a stacked structure to improve a reliability of a highly integrated semiconductor device.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a semiconductor device comprising:
   forming a first insulation layer on a first single crystalline structure including a single crystalline material, the first insulation layer having an opening that exposes the first single crystalline structure;
   forming a first seed layer including the single crystalline material in the opening;
   forming a first amorphous thin film on the first insulation layer and the first seed layer;
   changing a phase of a first region of the first amorphous thin film, the first region of the first amorphous thin film being overlapped with the first seed layer;
   transforming the first region of the first amorphous thin film into a first single crystalline thin film including the single crystalline material, by converting a crystalline structure of the first region of the first amorphous thin film into a single crystalline structure, using the single crystalline material in the first seed layer as a seed during a phase transition of the first region of the first amorphous thin film;
   changing a phase of a second region of the first amorphous thin film, the second region of the first amorphous thin film being adjacent to the first single crystalline thin film, wherein the first region of the first amorphous thin film has an area substantially larger than that of the second region of the first amorphous thin film; and
   transforming the second region of the first amorphous thin film into a second single crystalline thin film including the single crystalline material, by converting a crystalline structure of the second region of the first amorphous thin film into a single crystalline structure, using the single crystalline material in the first single crystalline thin film as a seed during a phase transition of the second region of the first amorphous thin film.

2. The method of claim 1, wherein the first single crystalline structure comprises a silicon substrate, a silicon-on-insulator substrate, a germanium substrate, or a silicon-germanium substrate.

3. The method of claim 1, wherein the first single crystalline structure is formed by converting a crystalline structure of an amorphous thin film into a single crystalline structure using a single crystalline material as a seed during a phase transition of the amorphous thin film including an amorphous material.

4. The method of claim 1, wherein the insulation layer comprises oxide.

5. The method of claim 1, wherein one opening is formed relative to one first single crystalline structure.

6. The method of claim 1, wherein one opening is formed relative to one unit cell of the first single crystalline structure.

7. The method of claim 1, wherein the first seed layer is formed from the first single crystalline structure exposed through the opening by a selective epitaxial growth process.

8. The method of claim 1, wherein changing the phases of the first and second regions of the first amorphous thin film comprises melting the first amorphous thin film.

9. The method of claim 8, wherein melting the first amorphous thin film comprises irradiating a laser beam onto a respective region of the first amorphous thin film.

10. The method of claim 1, further comprising polishing the first seed layer until the first insulation layer is exposed when the first seed layer is formed on the first insulation layer around the opening.

11. The method of claim 1, further comprising:
    changing a phase of an Nth (N is an integer greater than 3) region of the first amorphous thin film adjacent to the second single crystalline thin film; and
    transforming the Nth region of the first amorphous thin film into an Nth single crystalline thin film including the single crystalline material, by converting a crystalline structure of the Nth region of the first amorphous thin film into a single crystalline structure, using the single crystalline material in an (N−1)th single crystalline thin film as a seed during a phase transition of the Nth region of the first amorphous thin film.

12. The method of claim 11, wherein the second region of the first amorphous thin film has an area substantially larger than that of the Nth region of the first amorphous thin film.

13. The method of claim 1, further comprising repeatedly forming second to Pth (P is an integer greater than 3) insulation layers substantially the same as the first insulation layer, second to Mth (M is an integer greater than 3) seed layers substantially the same as the first seed layer, second to Kth (K is an integer greater than 3) amorphous thin films substantially the same as the first amorphous thin film, and third to Jth (J is an integer greater than 4) single crystalline structures substantially the same as the second single crystalline structure, on the second single crystalline structure.

14. A method of manufacturing a semiconductor device, comprising:

forming a first semiconductor structure including a transistor on a single crystalline silicon substrate;

forming a first insulation layer including an opening that exposes the single crystalline silicon substrate having the first semiconductor structure;

forming a first seed layer including single crystalline silicon in the opening by a selective epitaxial growth process;

continuously forming an amorphous silicon thin film on the first insulation layer and the first seed layer;

changing a phase of a first region of the first amorphous silicon thin film, the first region of the first amorphous silicon thin film being overlapped with the first seed layer;

transforming the first region of the first amorphous silicon thin film into a first single crystalline silicon thin film, by converting a crystalline structure of the first region of the first amorphous silicon thin film into the single crystalline silicon, using the single crystalline silicon in the first seed layer as a seed during a phase transition of the first region of the first amorphous silicon thin film;

changing a phase of a second region of the first amorphous silicon thin film adjacent to the first single crystalline silicon thin film; and transforming the second region of the first amorphous silicon thin film into a second single crystalline silicon thin film, by converting a crystalline structure of the second region of the first amorphous silicon thin film into the single crystalline silicon, using the single crystalline silicon in the first single crystalline silicon thin film as a seed during a phase transition of the second region of the first amorphous silicon thin film, to form a first channel layer including the first and the second single crystalline silicon thin films.

15. A method of forming an integrated circuit comprising:

successively laterally forming single crystalline thin film regions from an amorphous thin film using a lower single crystalline seed layer, wherein successively laterally forming single crystalline thin film regions comprises:

changing a phase of a first region of the amorphous thin film directly on the lower single crystalline seed layer to provide a first single crystalline thin film region;

changing a phase of a second region of the amorphous thin film in direct lateral contact with the first single crystalline thin film region to provide a second single crystalline thin film region; and changing a phase of a third region of the amorphous thin film in direct lateral contact with the second single crystalline thin film region to provide a third single crystalline thin film region.

16. The method according to claim 15, wherein successively laterally forming the single crystalline thin film regions comprises successively impinging laser light onto laterally spaced-apart regions of the amorphous thin film to change the phase thereof into the respective single crystalline thin film regions.

17. The method according to claim 16, wherein successively impinging the laser light onto the laterally spaced-apart regions of the amorphous thin film comprises substantially continuously moving the laser light laterally away from the lower single crystalline seed layer.

18. The method according to claim 16, wherein successively impinging the laser light onto the laterally spaced-apart regions of the amorphous thin film comprises moving the laser light laterally in discrete increments so that the laser light impinges the amorphous thin film at points corresponding to the respective single crystalline thin film regions.

19. The method according to claim 16, wherein successively impinging the laser light onto the laterally spaced-apart regions of the amorphous thin film comprises impinging the laser light onto the laterally spaced-apart regions of the amorphous thin film to heat the laterally spaced-apart regions of the amorphous thin film to a temperature of about 1410 degrees centigrade.

20. The method according to claim 16, wherein the lower single crystalline seed layer extends from a single crystalline silicon substrate to the amorphous thin film, the method further comprising heating the single crystalline silicon substrate at a temperature of about 200 to about 600° C. while impinging the laser light onto the amorphous thin film.

21. The method according to claim 15, wherein the first region of the amorphous thin film is larger than the second region of the amorphous thin film which is larger than the third region of the amorphous thin film.

22. The method according to claim 15, wherein the lower single crystalline seed layer comprises a vertical single crystalline silicon plug in an insulating layer.

23. The method according to claim 15, wherein successively laterally forming the single crystalline thin film regions from an amorphous thin film using a lower single crystalline seed layer comprises successively laterally forming the single crystalline thin film regions in a peripheral region of the integrated circuit.

\* \* \* \* \*